United States Patent
Glover

(10) Patent No.: US 6,242,690 B1
(45) Date of Patent: Jun. 5, 2001

(54) GASKET SYSTEM FOR EMI ISOLATION

(75) Inventor: Hugh Brian Glover, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 676 days.

(21) Appl. No.: 08/533,429

(22) Filed: Sep. 25, 1995

(51) Int. Cl.⁷ ...................................................... H05K 9/00
(52) U.S. Cl. ........................... 174/35 GC; 174/35 R; 361/752; 361/753; 361/816
(58) Field of Search ............... 174/35 GC, 35 R; 361/752, 753, 769, 787, 799, 800, 816, 818; 277/901; 439/927

(56) References Cited

U.S. PATENT DOCUMENTS

| | | | |
|---|---|---|---|
| 3,296,356 | 1/1967 | McAdams | 174/35 GC |
| 3,304,360 | 2/1967 | Hadley et al. | 174/35 GC |
| 4,396,795 | * 8/1983 | Bogner | 174/35 GC |
| 4,554,400 | * 11/1985 | Schmalzl | 174/35 GC |
| 5,053,924 | 10/1991 | Kurgan | 361/818 |
| 5,070,216 | 12/1991 | Thornton | 174/35 GC |
| 5,205,751 | 4/1993 | Schwartz et al. | 439/86 |
| 5,252,782 | 10/1993 | Cantrel et al. | 174/35 R |

FOREIGN PATENT DOCUMENTS

| | | | |
|---|---|---|---|
| 56-10507 | 3/1981 | (JP) | F16J/15/32 |
| 5218674 | 8/1993 | (JP) . | |
| 9115939 | 10/1991 | (WO) . | |

\* cited by examiner

*Primary Examiner*—Dean A. Reichard
*Assistant Examiner*—Hung V. Ngo

(57) ABSTRACT

An electromagnetic interference (EMI) gasket system which segregates EMI sensitive circuits from EMI generating circuits is disclosed. The gasket system includes a pair of deflectable leg members disposed relative to each other, which deflect vertically and horizontally when said gasket system is positioned between two opposing substrates and the substrates are drawn together. The leg members provide dual contact with one of the substrates to ensure EMI attenuation without any compression of said gasket.

18 Claims, 4 Drawing Sheets

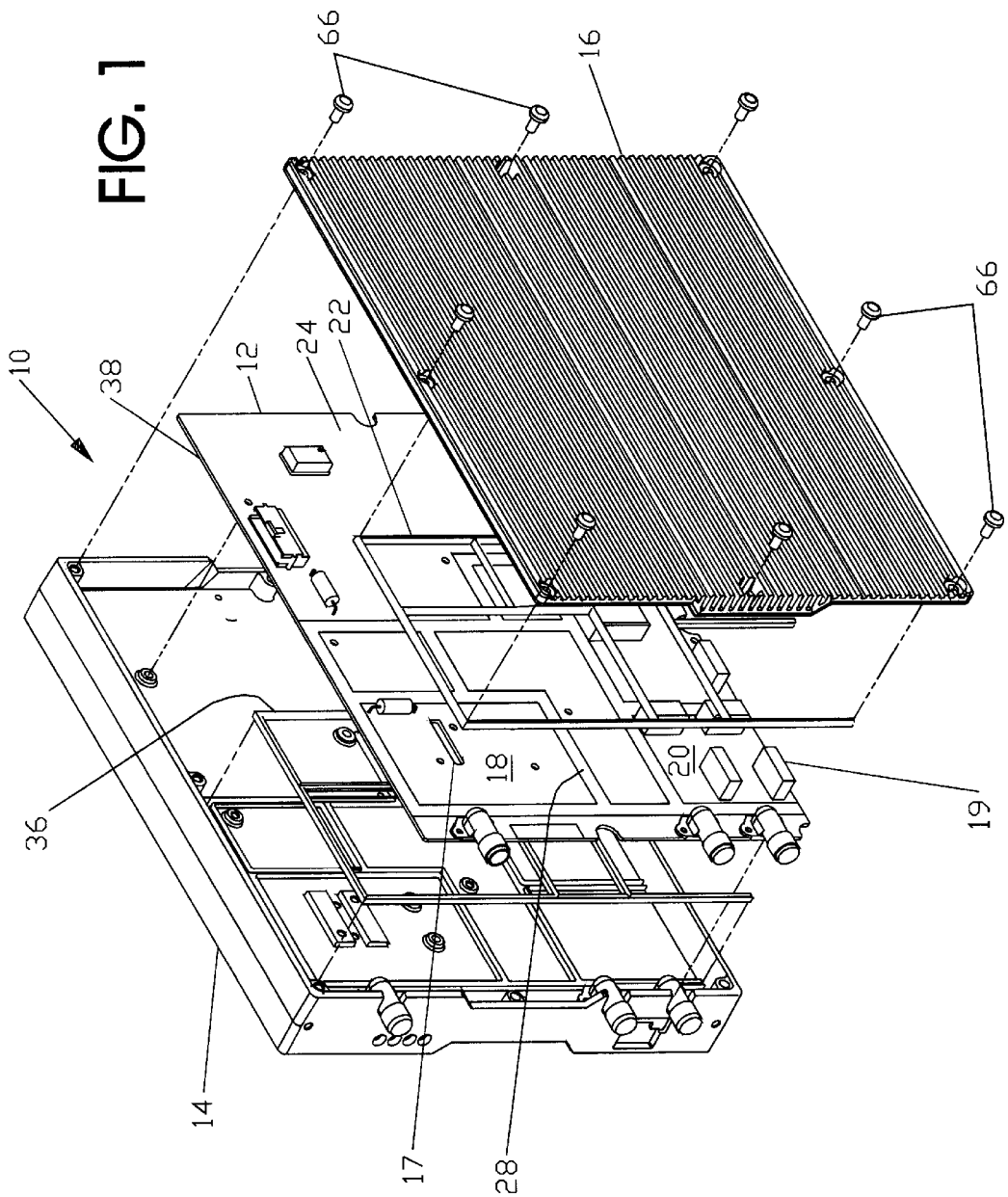

FIG. 2B

GASKET SYSTEM FOR EMI ISOLATION

BACKGROUND OF THE INVENTION

The present invention relates generally to providing electromagnetic interference (EMI) isolation of sensitive circuit areas on a circuit board and more particularly to a deflection-type gasket for providing EMI isolation by substantially attenuating EMI.

EMI is often encountered in the design of electronic circuits. Semiconductor devices such as metal oxide semiconductor field effect transistors (MOSFETs) and bipolar junction transistors (BJTs), which are widely used in electronic circuits, usually operate at frequencies ranging from several kilohertz to gegahertz. Unfortunately, operation at such frequencies produces EMI, which may cause malfunction in electronic equipment.

For example, an electronic device may contain several circuits some of which may generate EMI and others which do not generate EMI. Circuits which do not generate EMI may be adversely affected when EMI propagates to those areas. Circuits which generate EMI are herein referred to as EMI generating circuits and circuits which are affected by EMI propagation are herein referred to as EMI sensitive circuits.

EMI propagation between the EMI generating circuits and the EMI sensitive circuits is known as cross talk. Because it is necessary to prevent cross talk, both EMI generating circuits and EMI sensitive circuits are commonly shielded, and thus isolated from each other.

In one existing shielding arrangement, metal shield cans or lids are mounted on the printed circuit (PC) board to isolate the EMI generating circuits from the EMI sensitive circuits.

In another shielding arrangement, circuits which are susceptible to cross talk are fabricated on different circuit boards. The circuit boards are then mounted on a circuit board holder formed into a plurality of cells, each cell retaining a single circuit board. The circuit boards are thus isolated from each other in different cells of the circuit board holder.

These structures, while providing isolation between circuits susceptible to cross-talk, are complex, requiring additional material and manufacturing processes and are, therefore, costly to manufacture. Furthermore, they are inefficient in utilizing scarce space available on the circuit board and require the product into which they are incorporated to be larger to accommodate these larger, more complex structures. Efficient use of space can be a vital concern in some applications such as wireless communications and cellular telephony where smaller, more compact units or equipment are desired.

One prior art arrangement for isolating EMI generating circuits and EMI sensitive circuits is disclosed and claimed in U.S. Pat. No. 5,252,782 which describes a single board EMI isolation system comprising a "clam shell" to enclose either the EMI generating circuits or the EMI sensitive circuits or both on the circuit board. A simple compressible conductive gasket is positioned around the perimeter of the circuit to be isolated between the rim of the clam shell and the surface of the circuit board to enhance the EMI isolation.

While the above structure provides efficient utilization of space on the circuit board, it may fail to provide a satisfactory level of EMI attenuation because the circuits to be isolated must be substantially completely sealed off to prevent cross-talk. This is achieved by tightly securing the clam shell to the circuit board which could result in overly compressing the gasket between the rim of the clam shell and the circuit board. Typically, a plurality of fasteners are used to tightly seal such a clam shell and gasket configuration to a circuit board to provide effective EMI attenuation. If care is not taken during assembly, the fasteners may be over tightened or may require excessive tightening to provide an effective seal, causing the gasket to be overly compressed, and even possible deformation of the circuit board. In addition, excessive tightening of the gasket may result in a phenomenon known as "compression set" wherein the gasket permanently assumes a compressed state and loses its resilient property. These adverse conditions may result in gaps in the EMI shielding formed by the clam shell and gasket combination and resultant leakage of EMI between the EMI generating and EMI sensitive circuits.

Known prior art EMI isolation systems of the type just described utilize a gasket designed to be compressed to seal off the circuit areas susceptible to cross-talk and to achieve satisfactory attenuation of EMI propagation. These systems, however, only provide a single location or line of sealing contact where the gasket is compressed between the clam shell and the circuit board which can result in leakage or ineffective attenuation of EMI propagation from the EMI generating circuits to the EMI sensitive circuits, if not assembled correctly as just described.

In view of the foregoing disadvantages, there is a need for a new gasket structure which achieves a satisfactory level of EMI attenuation with a simple structure that is easy to assemble and less expensive to manufacture, and which does not cause compression of the gasket or deformation of the circuit board.

SUMMARY OF THE INVENTION

It is, accordingly, a primary object of the present invention to provide a novel gasket system for substantially attenuating the propagation of EMI from the EMI generating circuits to the EMI sensitive circuits on a circuit board, and which is not subject to the foregoing disadvantages.

It is another object of the present invention to provide a gasket system which substantially attenuates the propagation of EMI without requiring compression of the gasket, and thereby prevents any deformation of the circuit board.

It is yet another object of the present invention to provide a gasket system which requires a fewer number of fasteners to tightly seal off a desired circuit area and satisfactorily attenuate EMI than prior art gaskets.

In accordance with the present invention, a gasket system to substantially attenuate the propagation of EMI includes a pair of deflectable leg members disposed relative to each other to cause the leg members to deflect horizontally and vertically when the gasket system is positioned between two opposing substrates and the substrates are drawn together so that the leg members provide dual contact with one substrate.

In one embodiment of the present invention, a means is provided to limit the peak deflection of the leg members. In another embodiment of the present invention, a means for retaining the gasket system in a predetermined position on one of the substrates is provided.

These and other objects of the invention, together with the features and advantages thereof, will become apparent from the following detailed specification when read with the accompanying drawings in which like reference numerals refer to like elements.

BRIEF DESCRIPTION OF THE DRAWINGS

FIG. 1 is an exploded perspective view of an unassembled electronic device including a gasket system in accordance with the present invention.

FIG. 2B is a detailed cross-sectional view of the gasket system of FIG. 2A after final assembly showing the deflection of the leg members in their operable position.

DETAILED DESCRIPTION OF THE PREFERRED EMBODIMENTS

Figure 2A:
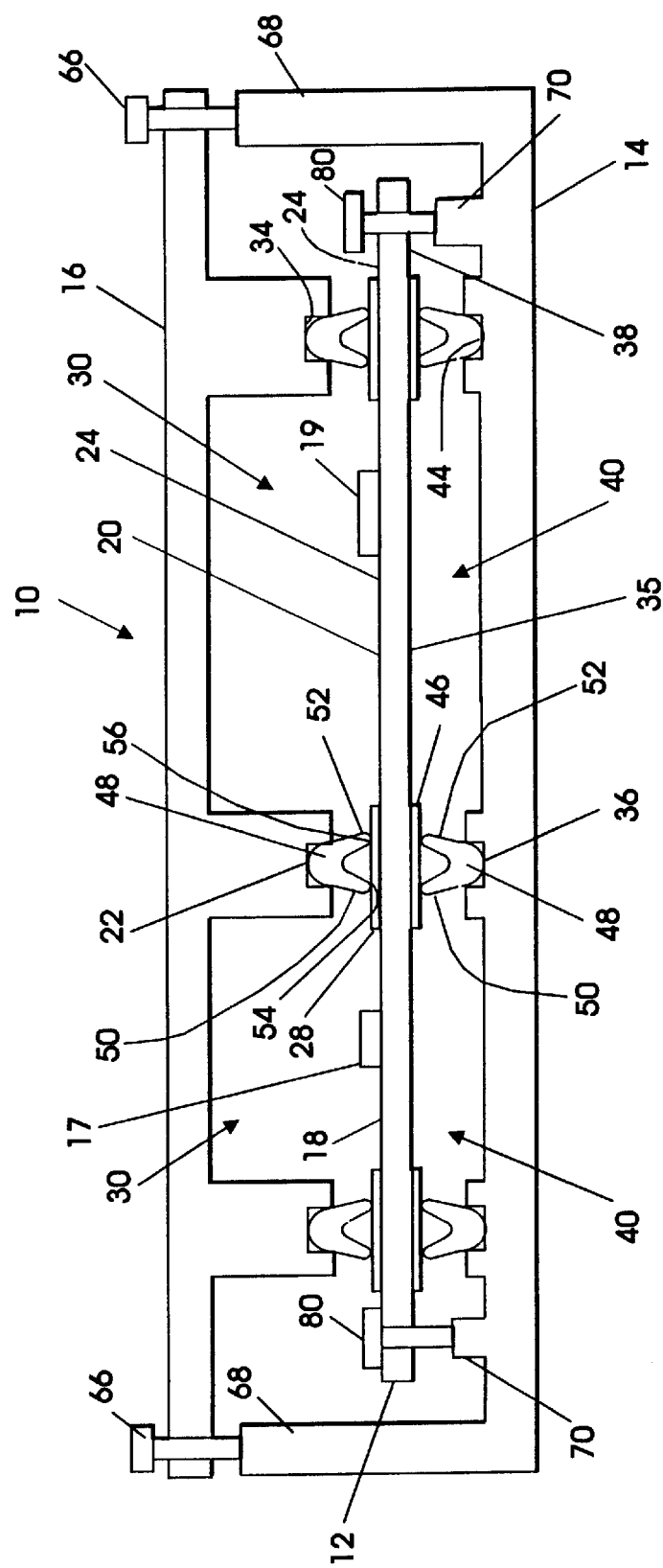
FIG. 2A is a detailed cross-sectional view of the gasket system in accordance with one embodiment of the present invention prior to final assembly and deflection of the leg members.

Referring initially to FIG. 1, an enclosure assembly indicated generally by a reference numeral 10 for enclosing a circuit board 12 includes an enclosure base 14 and a cover shield 16. EMI generating circuits 17 can be fabricated in an area 18, while EMI sensitive circuits 19 can be fabricated in an area 20. The circuit board 12 can be divided into several EMI generating circuit areas 18 and EMI sensitive circuit areas 20. A cover gasket 22 is positioned between one surface 24 of the circuit board 12 and the cover shield 16, and is correspondingly aligned to the perimeters of the EMI generating circuit areas 18 and EMI sensitive circuit areas 20. A conductive trace 28 referred to herein as a "ground track" is fabricated on the circuit board 12 around the perimeters of the EMI generating and EMI sensitive circuit areas 18 and 20.

Figure 2B:
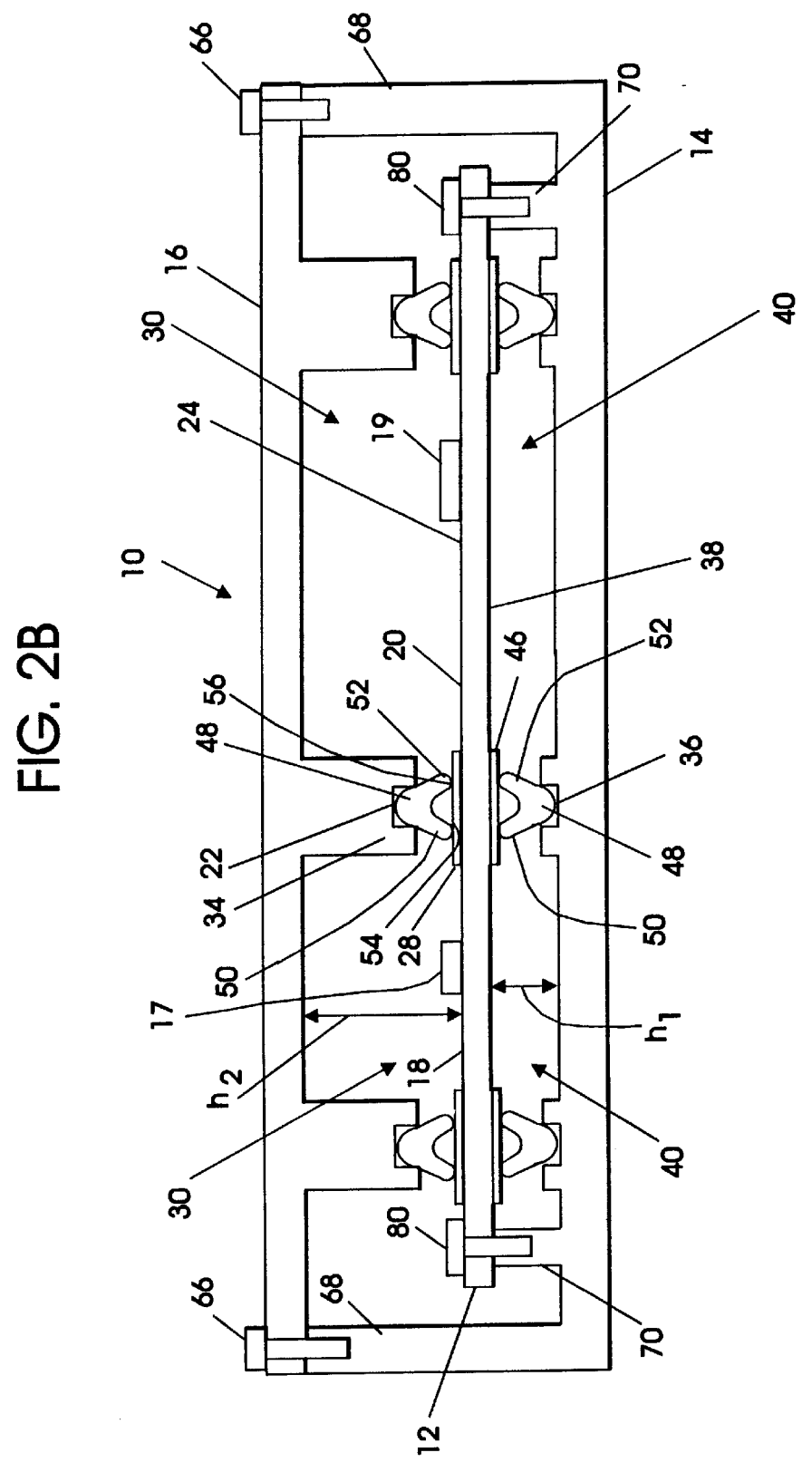

Referring also to FIGS. 2A and 2B, the cover shield 16 is divided into a plurality of compartments 30 by grooved retainers 34 surrounding the compartments 30. The retainers 34 may be integrally formed on the cover shield 16. The retainers 34 are aligned with the ground track 28 when the circuit board 12 is assembled with the cover shield 16. They retain the cover gasket 22 in a proper position so that it is aligned with and is in contact with the ground track 28 when the enclosure 10 is assembled.

The compartments 30 and the cover gasket 22 separate the EMI generating circuit areas 18 from the EMI sensitive circuit areas 20 by forming enclosed shields in cooperation with the cover shield 16 around both the EMI generating and EMI sensitive circuit areas 18 and 20. The enclosed shields substantially attenuate EMI from propagating from the EMI generating circuit areas 18 to the EMI sensitive circuit areas 20 which could adversely affect the operation of the EMI sensitive circuits.

An enclosure gasket 36 is positioned between an opposite surface 38 of the circuit board 12 and the enclosure base 14. The enclosure base 14 is divided into a plurality of compartments 40 by a groove or retainers 44 around the compartments 40. A second ground track 46 (shown in FIG. 2A and 2B) is fabricated on the opposite surface 38 of the circuit board 12, and is aligned with the first ground track 28 on the surface 24 of the circuit board 12. The retainers 44 which are aligned with the ground track 46 retain the enclosure gasket 36 in a proper position relative to the ground track 46 during assembly. The enclosure gasket 36 will then be positioned in proper alignment with and in contact with the ground track 46 as best shown in FIGS. 2A and 2B after final assembly.

The gasket 36 and ground track 46 form a shield between compartments 40 and divide the opposite side 38 of the circuit board 12 into different areas corresponding to and positioned directly opposite to the EMI generating and EMI sensitive circuit areas 18 and 20. This structure prevents EMI propagation from the EMI generating circuit 17 in area 18 from propagating through the circuit board 12 to the opposite side 38 of the circuit board 12 and then back through the circuit board 12 to the EMI sensitive circuit 19 in area 20.

The cover gasket 22 is made from a mixture of silicone and electrically conductive fibers which provide electrical contact between the cover shield 16 and the ground track 28; this causes the cover shield 16 to be maintained at ground potential.

Likewise, the enclosure gasket 36 is also made from a mixture of silicone and electrically conductive fibers to provide electrical contact between the enclosure base 14 and the ground track 46 of the circuit board 12; this causes the enclosure base 14 to also be maintained at ground potential.

Accordingly, the opposing gaskets 22 and 36 and ground tracks 28 and 46 essentially form a barrier between cover 16 and base 14 to EMI propagation.

The gaskets 22 and 36 each include a main body member 48 and a pair of leg members 50 and 52 disposed relative to each other. The main body member 48 is sized to be retained by retainers 34 or 44 to hold gasket 22 or 36 in a predetermined position relative to the ground track 28 or 46 to cause the leg members 50 and 52 to contact the ground track 28 or 46 at two separate points of contact 54 and 56.

While the present invention has been described with respect to the retainers 34 and 44 for holding the main body member 48 of gaskets 22 and 36, an electrically conductive adhesive 78 (shown in FIG. 3) or similar arrangement could be used as well to retain the gaskets 22 and 36 in place relative to ground tracks 28 and 46 to provide the dual contact described above.

Fasteners 66, such as a bolt or the like, are screwed through bosses 68 formed on the enclosure base 14 to secure the cover shield 16 to the enclosure base 14. Likewise, fasteners 80, such as a bolt or the like, may be used to attach the circuit board 12 to the enclosure base 14 by threading into bosses 70.

When the circuit board 12 is drawn toward the enclosure base 14 by the fasteners 80, the leg members 50 and 52 of the enclosure gasket 36 initially come in contact with the ground track 46 as shown in FIG. 2A. As the circuit board 12 is further drawn toward the enclosure base 14 by tightening the fasteners 80, the leg members 50 and 52 deflect horizontally and vertically while maintaining dual contact with the ground track 46 as shown in FIG. 2B.

Similarly when the fasteners 66 are tightened, the leg members 50 and 52 of the cover gasket 22 initially come in contact with the ground track 28. As the cover shield 16 and the cover gasket 22 are further drawn toward the circuit board 12 by tightening the fasteners 66, the leg members 50 and 52 deflect horizontally and vertically while maintaining dual contact with the ground track 28.

The bosses 70 maintain a predetermined space of height $h_1$ between the circuit board 12 and the enclosure base 14. As the fasteners 80 are tightened, the enclosure base 14 is drawn closer to the circuit board 12 until the ends of the bosses 70 contact the circuit board 12. After the ends of the bosses 70 contact the circuit board 12, the fasteners 80 cannot be tightened any further. By limiting the extent to which fasteners 80 can be tightened, the predetermined space of height $h_1$ is maintained between the circuit board 12 and the enclosure base 14. As a result, the peak deflection of the leg members 50 and 52 of the enclosure gasket 36 is limited. By limiting the peak deflection of the leg members 50 and 52, compression of the enclosure gasket 36 is eliminated, and deformation of the circuit board 12 is prevented. Furthermore, limiting the peak deflection of the leg members 50 and 52 prevents them from being overly deflected and, thus, flattened out, which allows the leg members 50 and 52 to maintain dual contact with the ground track 46.

Likewise, the bosses 68 maintain a predetermined space of height $h_2$ between the cover shield 16 and the circuit board 12 when assembled. As the fasteners 66 are tightened, the cover shield 16 is drawn closer to the circuit board 12 until the ends of the bosses 68 contact the circuit board 12. After the ends of the bosses 68 contact the circuit board 12, the fasteners 66 cannot be tightened any further. By limiting the extent to which fasteners 66 can be tightened, the predetermined space of height $h_2$ is maintained between the cover shield 16 and the circuit board 12. As a result, the peak deflection of the leg members 50 and 52 of the cover gasket 22 is limited. By limiting the peak deflection of the leg members 50 and 52, the compression of the cover gasket 22 is eliminated, and deformation of the circuit board 12 is prevented. Furthermore, limiting the peak deflection of the leg members 50 and 52 prevents the leg members from being overly deflected and, thus, flattened out, which allows the leg members 50 and 52 to maintain dual contact with the ground track 28.

The gaskets 22 and 36 of the present invention may be referred to as deflection-type gaskets in contrast to prior art compression-type gaskets because the gaskets of the present invention incorporate a pair of leg members 50 and 52, which deflect horizontally and vertically as the fasteners 66 and 80 are tightened and the enclosure base 14 and cover shield 16 are drawn to their respective predetermined spacing relative to the circuit board 12.

Those skilled in the art will recognize that the deflection-type gasket of the present invention does not require a high degree of clamping force on the gasket compared to compression type gaskets to provide an effective seal for attenuation of EMI. Because there is no compression of the gaskets 22 and 36 deformation of the circuit board 12 is avoided. Additionally, because deflection type gaskets 22 and 36 use much less force compared to prior art compression type gaskets, fewer fasteners are required to provide a uniform seal to satisfactorily attenuate EMI which reduces assembly time and expense.

More importantly, the leg members of the gaskets 22 and 36 provide dual contact at locations 54 and 56 with the ground tracks 28 and 46. The dual contact between the gaskets 22 and 36 and the ground tracks 28 and 46 insures more uniform sealing or isolation with minimal if any formation of leaks, and therefore, better and more reliable attenuation of EMI compared to prior art gaskets or gaskets with contact at only a single location.

Therefore, the leg members 50 and 52 of the gaskets 18 and 36 serve two important functions: first, they provide dual contact with the ground tracks 28 and 46, which results in substantial attenuation of EMI and secondly, they deflect horizontally and vertically, which eliminates compression of the gasket and prevents deformation of the circuit board 12.

Figure 3:
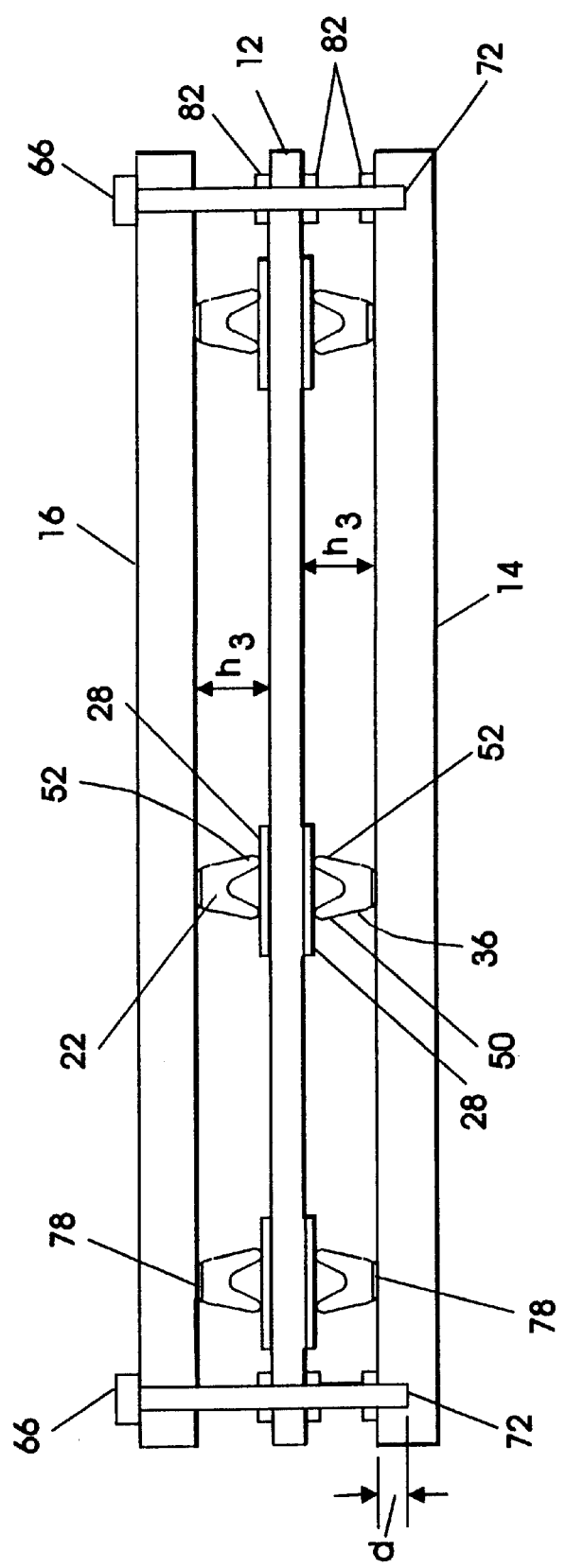
FIG. 3 is a detailed cross-sectional view of the gasket system in accordance with another embodiment of the present invention.

Referring to FIG. 3, in another embodiment of the invention, the fasteners 66 are received into threaded holes or receptacles 72 which are formed into the enclosure base 14 to a predetermined depth d which limits the extent to which the fasteners 66 can be tightened. By limiting the extent to which the fasteners 66 can be tightened, the receptacles 72 maintain a predetermined height $h_3$ between the cover shield 16 and the circuit board 12 and between the enclosure base 14 and the circuit board 12; this eliminates the compression of the gaskets 22 and 36, and the deformation of the circuit board 12.

Those skilled in the art will recognize that other means for maintaining a predetermined space of height $h_3$ between the cover shield 16 and the circuit board 12 and between the enclosure base 14 and the circuit board 12 may be implemented such as a land or collar 82 attached to the fasteners 66. The land or collar 82 formed on the fasteners 66 can limit the extent to which the fasteners 66 may be screwed into the enclosure base 14, thus limiting the peak deflection of leg members 50 and 52 of the gaskets 22 and 36. Such means can effectively eliminate the compression of the gaskets 22 and 36, and prevent the deformation of the circuit board 12.

While the present invention has been described with respect to its preferred embodiments, those skilled in the art will recognize that the present invention is not limited to the specific embodiments described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention. While the present invention has been described herein in detail in relation to its preferred embodiments, it is to be understood that this disclosure is only illustrative and exemplary of the present invention and is made merely for purposes of providing a full and enabling disclosure of the invention. Accordingly, it is intended that the invention be limited only by the spirit and scope of the claims appended hereto.

What is claimed is:

1. A gasket system for attenuating the propagation of electromagnetic interference, comprising:

a pair of deflectable leg members disposed relative to each other to cause said leg members to deflect away from each other when said gasket system is positioned between two opposing substrates and the substrates are drawn together so that said leg members provide dual contact with one of the substrates to substantially attenuate electromagnetic interference across said gasket system; and means for limiting the deflection of said pair of deflectable leg members;

wherein said limiting means is a boss formed on at least one of the substrates to contact the surface of the other of the substrates when drawn together.

2. The gasket system of claim 1, further comprising means for retaining said gasket system in a predetermined position on one of the substrates during the assembly of the substrates.

3. The gasket system of claim 2, wherein the retaining means is an adhesive.

4. The gasket system of claim 2, wherein the retaining means is a groove formed in one of the substrates.

5. A gasket system for attenuating the propagation of electromagnetic interference, comprising:

a pair of deflectable leg members disposed relative to each other to cause said leg members to deflect away from each other when said gasket system is positioned between two opposing substrates and the substrates are drawn together so that said leg members provide dual contact with one of the substrates to substantially attenuate electromagnetic interference across said gasket system; and means for limiting the deflection of said pair of deflectable leg members;

wherein said limiting means is a land attached to a fastener to prevent the substrates from being drawn too close together to maintain a predetermined gap between the substrates.

6. A gasket system for attenuating the propagation of electromagnetic interference, comprising:

a pair of deflectable leg members disposed relative to each other to cause said leg members to deflect away from each other when said casket system is positioned between two opposing substrates and the substrates are drawn together so that said leg members provide dual contact with one of the substrates to substantially attenuate electromagnetic interference across said gasket system; and means for limiting the deflection of said pair of deflectable leg members;

wherein said limiting means is a threaded receptacle having a predetermined depth and formed in one of the substrates to maintain a predetermined gap between the substrates when a mating threaded fastener is inserted through a hole in the other of the substrates and is screwed completely into said threaded receptacle.

7. A gasket system for attenuating the propagation of electromagnetic interference, comprising:

a main body member;

a pair of deflectable leg members disposed relative to each other and attached to one side of said body member to cause said leg members to deflect away from each other when said gasket system is positioned between two opposing substrates and the substrates are drawn together so that said leg members provide dual contact with one of the substrates to substantially attenuate electromagnetic interference across said gasket system; and means for limiting the deflection of said pair of deflectable leg members;

wherein said limiting means is a boss formed on at least one of the substrates to contact the surface of the other of said substrates when drawn together.

8. The gasket system of claim 7, further comprising a ground track formed on said one of the substrates and positioned thereon so that each of said leg members is in contact with said ground track.

9. The gasket system of claim 8, wherein said gasket contains electrically conductive material and said ground track and said one of the substrates are also manufactured from electrically conductive material, said gasket maintaining electrical contact between said one of the substrates and said ground track.

10. The gasket system of claim 7, further comprising means for retaining said gasket system in a predetermined position on one of the substrates during assembly of the substrates.

11. The gasket system of claim 10, wherein the retaining means is adhesive.

12. The gasket system of claim 10, wherein the retaining means is a groove.

13. A gasket system for attenuating the propagation of electromagnetic interference, comprising:

a main body member;

a pair of deflectable leg members disposed relative to each other and attached to one side of said body member to cause said leg members to deflect away from each other when said gasket system is positioned between two opposing substrates and the substrates are drawn together so that said leg members provide dual contact with one of the substrates to substantially attenuate electromagnetic interference across said gasket system; and means for limiting the deflection of said pair of deflectable leg members;

wherein said limiting means is a land attached to a fastener to prevent the substrates from being drawn too close together to maintain a predetermined gap between the substrates.

14. A gasket system for attenuating the propagation of electromagnetic interference, comprising:

a main body member;

a pair of deflectable leg members disposed relative to each other and attached to one side of said body member to cause said leg members to deflect away from each other when said gasket system is positioned between two opposing substrates and the substrates are drawn together so that said leg members provide dual contact with one of the substrates to substantially attenuate electromagnetic interference across said gasket system; and means for limiting the deflection of said pair of deflectable leg members;

wherein said limiting means is a threaded receptacle having a predetermined depth and formed in at least one of the substrates when a mating threaded fastener is inserted through a hole in the other of the substrates and is screwed completely into said threaded receptacle.

15. A gasket system for attenuating the propagation of electromagnetic interference, comprising;

a main body member; and a pair of deflectable leg members disposed relative to each other and attached to one side of said body member to cause said leg members to deflect away from each other when said gasket system is positioned between two opposing substrates and the substrates are drawn together so that said leg members provide dual contact with one of the substrates to substantially attenuate electromagnetic interference across said gasket system;

wherein one of said substrates is a circuit board and the other of said substrates is a conductive shield.

16. A gasket system for attenuating the propagation of electromagnetic interference, comprising:

a conductive enclosure base;

a conductive cover shield;

a circuit board disposed between said base and said cover shield;

a first ground track formed on one side of the circuit board;

a first gasket having a pair of deflectable leg members positioned between the cover shield and said one side of said circuit board so that said leg members are in contact with said first ground track;

a second ground track formed on an opposite side of said circuit board; and a second gasket having a pair of deflectable leg members positioned between the enclosure based and said opposite side of said circuit board so that said second gasket leg members are in contact with said second ground track, said leg members of each of said first and second gaskets respectively deflecting away from each other when in respective contact with said first and second ground tracks.

17. The gasket system of claim 16, wherein said first and second gaskets are aligned relative to one another on opposite sides of said circuit board when a device containing said gasket system is assembled to provide a barrier between said enclosure base and said cover shield to attenuate EMI propagation from an EMI generating circuit on said circuit board to an EMI sensitive circuit on said circuit board.

18. The gasket system of claim 16, further comprising means for limiting deflection of said leg members of said first and second gaskets.

* * * * *